United States Patent
Lutgen et al.

(10) Patent No.: US 9,397,262 B2
(45) Date of Patent: Jul. 19, 2016

(54) OPTOELECTRONIC SEMICONDUCTOR CHIP AND METHOD FOR THE PRODUCTION THEREOF

(75) Inventors: Stephan Lutgen, Regensburg (DE); Christoph Eichler, Tegernheim (DE); Marc Schillgalies, Berlin (DE); Desiree Queren, Neutraubling (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 226 days.

(21) Appl. No.: 13/056,724

(22) PCT Filed: Jul. 21, 2009

(86) PCT No.: PCT/DE2009/001023
§ 371 (c)(1),
(2), (4) Date: Apr. 28, 2011

(87) PCT Pub. No.: WO2010/012266
PCT Pub. Date: Feb. 4, 2010

(65) Prior Publication Data
US 2011/0260202 A1 Oct. 27, 2011

(30) Foreign Application Priority Data
Jul. 31, 2008 (DE) .......................... 10 2008 035 784

(51) Int. Cl.
*H01L 33/00* (2010.01)
*H01L 33/24* (2010.01)
*H01L 21/02* (2006.01)
(Continued)

(52) U.S. Cl.
CPC ............ *H01L 33/24* (2013.01); *H01L 21/0237* (2013.01); *H01L 21/0254* (2013.01); *H01L 21/02458* (2013.01); *H01L 21/02494* (2013.01); *H01L 21/02587* (2013.01); *H01L 33/007* (2013.01); *H01S 5/2231* (2013.01); *H01L 31/0236* (2013.01); *H01L 33/486* (2013.01); *H01L 33/62* (2013.01); *H01L 2924/0002* (2013.01); *H01S 5/0421* (2013.01); *H01S 5/2009* (2013.01); *H01S 5/24* (2013.01); *H01S 5/3201* (2013.01); *H01S 5/3211* (2013.01);
(Continued)

(58) Field of Classification Search
CPC ... H01L 33/62; H01L 33/486; H01L 31/0236; H01L 133/24
USPC ........................................................ 257/99, 70
See application file for complete search history.

(56) References Cited

U.S. PATENT DOCUMENTS 6,078,064 A * 6/2000 Ming-Jiunn et al. .......... 257/103
6,377,596 B1 4/2002 Tanaka et al.
(Continued)

FOREIGN PATENT DOCUMENTS

DE 102 28 781 1/2003
DE 696 33 203 9/2005
(Continued)

*Primary Examiner* — Dale E Page
(74) *Attorney, Agent, or Firm* — Cozen O'Connor (57) ABSTRACT

An optoelectronic semiconductor chip (1) is herein described which comprises a non-planar growth layer (2), which contains at least one first nitride compound semiconductor material, and an active zone (5), which contains at least one second nitride compound semiconductor material and is arranged on the growth layer (2), and a top layer (7), which is arranged on the active zone (5), the growth layer (2) comprising structure elements (4) at a growth surface (3) facing the active zone (5).

19 Claims, 5 Drawing Sheets (51) Int. Cl.
*H01S 5/223* (2006.01)
*H01L 33/48* (2010.01)
*H01L 31/0236* (2006.01)
*H01L 33/62* (2010.01)
*H01S 5/042* (2006.01)
*H01S 5/20* (2006.01)
*H01S 5/24* (2006.01)
*H01S 5/32* (2006.01)

(52) U.S. Cl.
CPC ............ *H01S 5/3213* (2013.01); *H01S 5/3215* (2013.01); *H01S 2301/18* (2013.01); *H01S 2304/12* (2013.01)

(56) References Cited

U.S. PATENT DOCUMENTS 7,015,511 B2  3/2006  Sakai et al.
2002/0145148 A1*  10/2002  Okuyama et al. ............... 257/88
2005/0001227 A1  1/2005  Niki et al.
2005/0045894 A1  3/2005  Okuyama et al.
2005/0082544 A1  4/2005  Narukawa et al.
2006/0060833 A1  3/2006  Bruckner et al.
2008/0073655 A1  3/2008  Albrecht
2008/0149946 A1  6/2008  Kim et al.
2009/0250711 A1  10/2009  Kiyama et al.

FOREIGN PATENT DOCUMENTS

| DE | 10 2005 005 635 | 3/2006 |
| DE | 11 2006 002 192 | 6/2008 |
| EP | 1 280 190 | 1/2003 |
| EP | 1901357 | 3/2008 |
| TW | 200802973 | 1/2008 |
| TW | 200816529 | 4/2008 |
| WO | WO 2007/003684 | 2/2007 |

* cited by examiner

OPTOELECTRONIC SEMICONDUCTOR CHIP AND METHOD FOR THE PRODUCTION THEREOF

RELATED APPLICATIONS

This is a U.S. national stage of application No. PCT/DE2009/001023, filed on Jul. 21, 2009, and claims priority on German patent application No. 10 2008 035 784.7, filed on Jul. 31, 2008, the disclosure content of which is hereby incorporated by reference.

FIELD OF THE INVENTION

The present application relates to an optoelectronic semiconductor chip and to a method of producing an optoelectronic semiconductor chip.

BACKGROUND OF THE INVENTION

Semiconductor chips made from nitride compound semiconductors are particularly suitable for producing radiation with a wavelength in the shortwave visible or ultraviolet spectral range due to the relatively large band gap of nitride compound semiconductors.

Lattice mismatches within the semiconductor chip, for example between growth substrate and grown layers, may cause strain, which in the case of indium-containing nitride compound semiconductors may lead to spatial fluctuations of the indium, which has a negative effect on the crystal quality of the semiconductor chip.

Document US 2006/0060833 A1 describes a radiation-emitting optoelectronic component with an active zone having a quantum well structure which contains at least one first nitride compound semiconductor material, the quantum well structure being grown on at least one side facet of a non-planar structure, which contains at least one second nitride compound semiconductor material. The non-planar structure is produced with the assistance of a mask layer, which contains for example a silicon oxide or silicon nitride. By growing the quantum well structure onto a side facet, it is intended to reduce piezolelectric fields brought about by lattice mismatches and improve the homogeneity of the quantum well structure.

SUMMARY OF THE INVENTION

One object of the present invention is to provide an optoelectronic semiconductor chip with improved crystal quality.

A further object is to provide an efficient method of producing such an optoelectronic semiconductor chip.

According to a preferred embodiment, the optoelectronic semiconductor chip comprises a non-planar growth layer, which contains at least one first nitride compound semiconductor material, and an active zone, which contains at least one second nitride compound semiconductor material and is arranged on the growth layer, and a top layer, which is arranged on the active zone, the growth layer comprising structure elements at a growth surface facing the active zone.

The growth layer may be formed in a continuous way or comprise discontinuities. For example, the growth layer may be produced by structuring a planar layer. The structure elements produced may be made of the same material as the growth layer and contain at least one first nitride compound semiconductor material, which differs from the second nitride compound semiconductor material contained in the active zone.

Growth of the active zone may take place on the structure elements and/or in the spaces between the structure elements. The growth surface of the non-planar growth layer described herein is larger than the surface of a planar layer. The enlarged growth surface may reduce strain and thus defect formation, whereby in turn non-radiative recombination occurs less often and light yield may thus be increased.

The top layer may contain a semiconductor material such as for example AlGaAs.

In a preferred embodiment, the top layer contains a transparent conductive oxide or consists thereof. With a top layer of a transparent conductive oxide strain may be reduced relative to a layer of semiconductor material and thus the material quality may be improved.

Transparent conductive oxides ("TCO" for short) are transparent, conductive materials, generally metal oxides, such as for example zinc oxide, tin oxide, cadmium oxide, titanium oxide, indium oxide or indium tin oxide (ITO). In addition to binary metal-oxygen compounds, such as for example ZnO, $SnO_2$ or $In_2O_3$, the group of TCOs also includes ternary metal-oxygen compounds, such as for example $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of different transparent conductive oxides. Furthermore, TCOs do not necessarily correspond to a stoichiometric composition and may also be p- or n-doped.

The radiation produced in the active zone may be coupled out of the semiconductor chip through the top layer, which preferably contains a transparent conductive oxide. In addition, current may be impressed into the optoelectronic semiconductor chip by means of such a top layer. In particular, the top layer is arranged on the p-doped side of the semiconductor chip.

The top layer may be vapour-deposited or sputtered onto a layer of a first semiconductor region located therebelow. The first semiconductor region is arranged between the active zone and the top layer and preferably has a thickness of between at least 2 nm and at most 300 nm. The relatively small thickness of the first semiconductor region contributes to reducing strain in the semiconductor chip.

In the case of a laser diode chip, the top layer serves as a cladding layer, which replaces a cladding layer of semiconductor material. By means of the cladding layer, the optical wave may be guided laterally in the laser diode chip and at the same time shielded from metal contacts with high extinction coefficients on the upper side of the laser diode chip. Internal losses of the laser diode chip may be reduced in this manner.

Preferably, a TCO is selected for the top layer, which has a lower refractive index than the first semiconductor region, such that good wave guidance and shielding from the metal contacts is ensured by the top layer.

To grow conventional top layers or p-doped cladding layers from semiconductor material, relatively high temperatures of typically more than 1000° C. and relatively long growth times of more than one hour are necessary. In the case of a high indium content in the active zone, this may lead to diffusion of indium and thus to a reduction in crystal quality and modification of the wavelength. Advantageously, the use of a top layer containing TCO may lower the growth temperature, shorten growth time and reduce degradation of the active zone. In particular, the top layer of TCO may be produced at a temperature of at most 950° C., preferably at most 900° C., particularly preferably at most 300° C.

Preferably, the non-planar geometry of the growth layer continues into the active zone, i.e. the active zone in particular has a non-planar form determined by the growth layer or the structure elements. The growth layer may directly adjoin the active zone or be spaced from the active zone by interlayers.

The spacing is advantageously selected on the one hand to be large enough for there to be no risk of damage to the active zone from the structure elements, and on the other hand is selected to be sufficiently small for the non-planar geometry to continue into the active zone. The active zone is advantageously a continuous layer, which covers the growth surface. Typically, the active zone comprises a plurality of partial layers.

While the growth layer comprises structure elements at the growth surface and is thus not planar at the growth surface side, it is preferably of planar construction on an opposite side from the growth surface.

As a result of the non-planar geometry of the growth surface, the active zone arranged on the growth surface also has a non-planar geometry. In particular, both a surface facing the growth surface and a surface of the active zone remote from the growth surface are of non-planar construction.

The active zone comprises a pn-junction for producing radiation. In the simplest case, this pn-junction may be formed by means of a p-conducting and an n-conducting semiconductor layer, which directly adjoin one another. Preferably, the actual radiation-producing structure is provided between the p-conducting and n-conducting layers, for instance in the form of a doped or undoped quantum structure. The quantum structure may take the form of a single quantum well structure (SQW) or multiple quantum well structure (MQW) or indeed as a quantum wire or quantum dot structure.

According to a preferred embodiment, the second nitride compound semiconductor material, which is contained in the active zone, is an $In_{1-x-y}Al_xGa_yN$ with $0 \leq x<1$, $0 \leq y<1$ and $1-x-y \geq 0.15$. The indium fraction of at least 15% allows the production of radiation with a wavelength in the shortwave visible spectral range. In particular, the radiation emitted by the active zone has a wavelength $\lambda$ of 435 nm or greater. The optoelectronic semiconductor chip described here is particularly preferably intended for emitting green light.

Preferably, the first nitride compound semiconductor material, which is contained in the growth layer, is an $In_{1-x-y}Al_xGa_yN$ with $0 \leq x \leq 1$, $0 \leq y \leq 1$ and $x+y \leq 1$. In particular, the growth layer has a lower indium content than the active zone. Preferred materials for the growth layer are gallium nitride or indium gallium nitride.

The height of the structure elements may assume values from a few nanometers to a few hundred nanometers. The width of the structure elements may be of the order of magnitude of a few nanometers to a few micrometers.

In one advantageous configuration of the optoelectronic semiconductor chip, the structure elements have a height and width in the region of $\lambda/n$, preferably of at most $\lambda/n$. Advantageously, optical scattering losses at the boundary between the active zone and the growth layer may hereby be reduced.

"Height" should be understood to mean the longest dimension of a structure element in the vertical direction, i.e. parallel to the direction of growth. "Width" should be understood to mean the longest dimension of a structure element in a first lateral direction perpendicular to the direction of growth.

In the case of a circular cross-section, the longest dimension in the first lateral direction corresponds to the diameter. It is also possible for the structure elements to be elongate, for example rectangular. Rectangular structure elements may for example have a width of between 1 μm and 20 μm and a length of between 320 μm and 1000 μm. In this case, the "length" of the structure elements corresponds to the longest dimension in a second lateral direction, which extends perpendicularly to the first lateral direction. Here too, a preferred length is in the region of $\lambda/n$, preferably of at most $\lambda/n$.

The refractive index n denotes an average refractive index, which is calculated from the various refractive indices of the materials located in the semiconductor chip, with which radiation interacts.

The structure elements may be distributed at regular or irregular intervals over the growth surface. The manner in which they are distributed may be predetermined by the method used to produce the structure elements. For example, a regular structure may be produced by photolithography, while an irregular structure is produced using natural lithography, in which randomly distributed sprayed-on microspheres act as a mask.

Irrespective of the type of distribution, it is advantageous for the distances between the structure elements not to exceed values of a few nanometers up to a few micrometers.

Typically, the growth layer is itself grown on a substrate, before the active zone is arranged on the growth layer. Preferably, the growth layer is arranged between the active zone and the substrate and is part of a second semiconductor region.

Suitable substrates for growth of the growth layer and the active zone are in particular GaN, AlN, SiC or sapphire substrates. In this case, with an indium content of at least 15%, a lattice mismatch f of at least 2% may arise. Further suitable substrates contain for example InGaN or ZnO or consist thereof. In this case, with an indium content of at least 15%, a lattice mismatch f of at most 2% may arise.

The lattice mismatch f is calculated as follows:

$$f = [\text{lattice constant(active zone)} - \text{lattice constant(substrate)}]/\text{lattice constant(substrate)}.$$

By means of the growth layer described here, which comprises structure elements at the growth surface, it is advantageously possible to counteract troublesome crystal defects, which would be caused by the lattice mismatch f in the absence of a structured growth layer. As a result of the structuring of the growth layer, the active zone does not grow in a planar, two-dimensional manner. Instead, the growth surface may be enlarged by means, of structuring and three-dimensional, low-strain growth of the active zone may be achieved.

The greater is the lattice mismatch f between substrate and active zone, the greater should be the density of the structure elements and the smaller the width thereof.

If the lattice mismatch f between substrate and active zone is less than 2%, such as for example when InGaN template substrates or ZnO substrates are used, the density of the structure elements may be reduced and their width enlarged. In an extreme case, if the lattice mismatch f between substrate and active zone is less than 0.5%, the structure elements may be made so wide that the growth surface is nearly planar.

Preferably, substrates are used here in which the lattice mismatch f between substrate and active zone amounts to at least 0.5%.

The present patent application covers all forms of luminescent diodes which emit coherent and/or incoherent radiation. The luminescent diodes include light-emitting diodes (LEDs) and laser diode chips such as VECSELs, VCSELs or edge emitters.

In the case of a laser diode chip, a first waveguide layer adjoining the active zone may for example be provided with the structure elements.

According to a preferred variant of a method of producing an optoelectronic semiconductor chip as described above, a non-planar growth layer is formed, which contains at least one first nitride compound semiconductor material and comprises structure elements at a growth surface. Furthermore, an active zone, containing at least one second nitride compound semiconductor material, is arranged on the growth layer. In addition, a top layer is provided, which contains a transparent conductive oxide.

To produce the non-planar growth layer, a planar semiconductor layer, containing at least one first nitride compound semiconductor material, is preferably structured. Particularly preferably, structuring proceeds by means of photolithography, natural lithography, electron beam lithography, nano imprinting, wet chemical etching or dry etching. The structure elements produced thereby may be distributed regularly or irregularly over the growth surface. The structure elements may in particular be raised portions, which are for example hemispherical, cylindrical, pyramidal or elongate, for example rectangular, in form. It is however also possible for the structure elements to be recesses, which for example resemble holes, troughs or trenches.

In a further preferred embodiment, the non-planar growth layer is produced in that a nitride compound semiconductor material such as for example GaN or InGaN is applied at a comparatively low growth temperature of at most 850° C. At such a low growth temperature, no approximately smooth layer is formed, as in conventional epitaxial deposition, but rather a layer with a rough surface texture. Thus, in this embodiment structuring of the growth layer is achieved simply by the reduced growth temperature during deposition and further structuring is advantageously not necessary.

Growth of the growth layer and of the active zone onto the substrate may proceed by means of metalorganic vapour phase epitaxy (MOVPE) or molecular beam epitaxy (MBE).

BRIEF DESCRIPTION OF THE DRAWINGS

The above-described optoelectronic semiconductor chip and the method are explained in greater detail below with reference to FIGS. 1 to 9, in which.

DETAILED DESCRIPTION OF THE DRAWINGS

Identical or identically acting elements are provided with identical reference numerals in the Figures.

Figure 1:
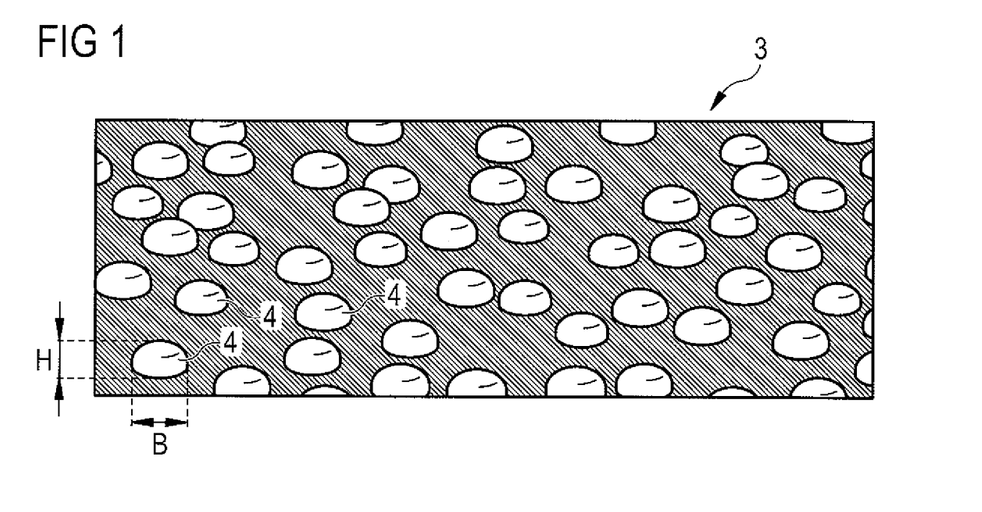
FIG. 1 shows an SEM micrograph of a first exemplary embodiment of a growth surface.

FIG. 1 shows an enlarged portion of the growth surface 3 of a growth layer according to a first exemplary embodiment. Here the growth surface 3 comprises structure elements 4 which are hemispherical in form.

The height H and the width B of a respective structure element 4 are in the region of $\lambda/n$ and preferably do not exceed this value. For example, in the case illustrated B≈174 nm and H≈62 nm. The structure elements 4 are distributed irregularly over the growth surface 3. Such a distribution arises for example through the use of natural lithography, in which polystyrene microspheres are applied to a layer to be structured. The polystyrene microspheres are distributed irregularly over the surface of the layer. The layer is etched in the spaces between the microspheres. The irregularly distributed structure elements 4 thus arise under the polystyrene microspheres.

The distances between the structure elements 4 are preferably no greater than a few nanometers up to a few micrometers.

Figure 2:
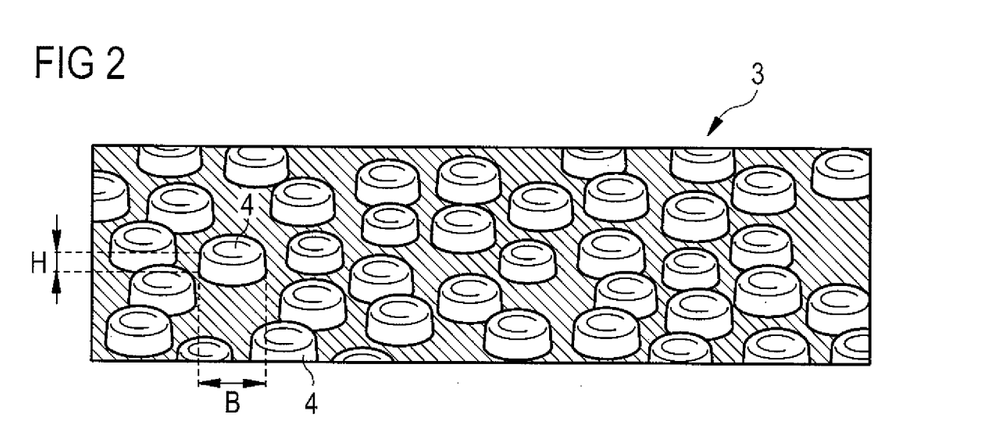
FIG. 2 shows an SEM micrograph of a second exemplary embodiment of a growth surface.

FIG. 2 shows a further exemplary embodiment of a growth surface 3. Here the structure elements 4 are cylindrical or take the form of a truncated pyramid. The width may amount to B≈290 nm and the height to H≈88 nm.

Both the structure elements 4 shown in FIG. 1 and those shown in FIG. 2 contribute to enlarging the surface area of the growth layer, such that indium-rich layers may be deposited on the growth layer, which layers are under less strain and therefore have a lower defect density.

Figure 3:
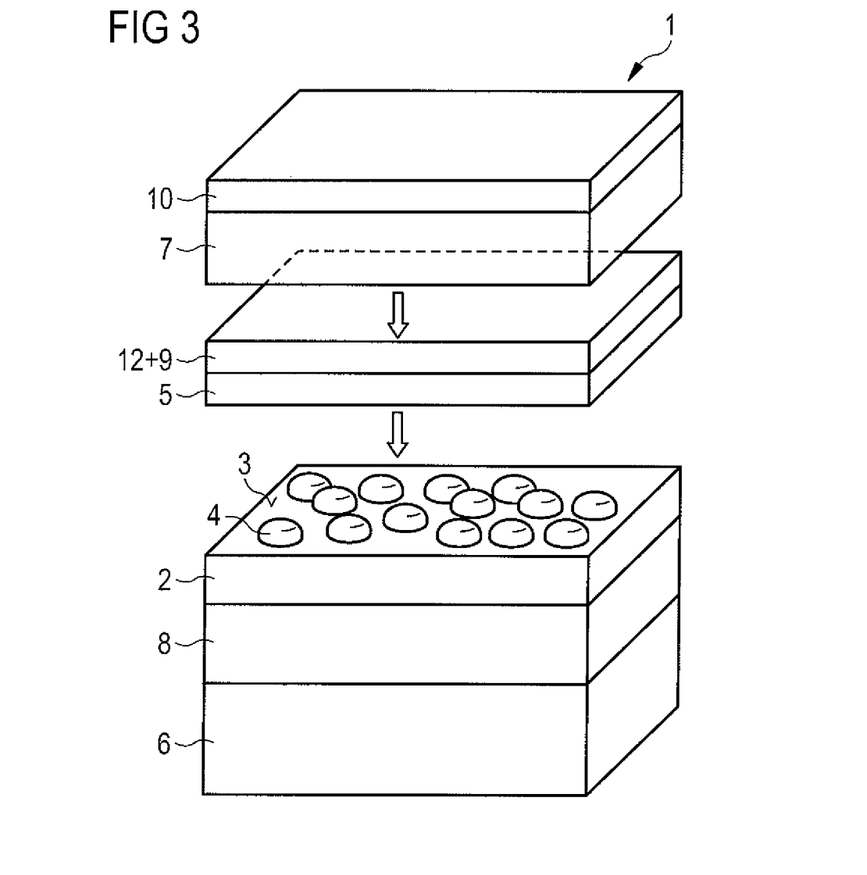
FIG. 3 is an exploded representation of a layer structure of an optoelectronic semiconductor chip.

FIG. 3 shows the layer structure of an optoelectronic semiconductor chip 1. On a substrate 6 is arranged a growth layer 2, which is planar on a side facing the substrate 6 and comprises a growth surface 3 with a plurality of structure elements 4 on a side remote from the substrate 6. The active zone 5, which in particular comprises a quantum structure, is arranged on the growth layer 2.

The substrate 6 may for example contain GaN, AlN, SiC or sapphire or consist thereof. The growth layer 2 contains at least one first nitride compound semiconductor material of the above-stated type, preferably GaN and/or InGaN. The active zone 5 contains at least one second nitride compound semiconductor material with an indium content of at least 15%. Such an indium content enables the production of radiation with a wavelength in the shortwave visible spectral range, in particular in the green spectral range with a wavelength greater than 435 nm.

The active zone 5 may be deposited directly on the growth layer 2. It is also possible, however, for at least one layer to be arranged between the growth layer 2 and the active zone 5. The spacing between the active zone 5 and the growth layer 2 is advantageously selected on the one hand to be large enough for there to be no risk of damage to the active zone 5 from the structure elements 4, and on the other hand is selected to be sufficiently small for the non-planar geometry to continue into the active zone 5.

Figure 4:
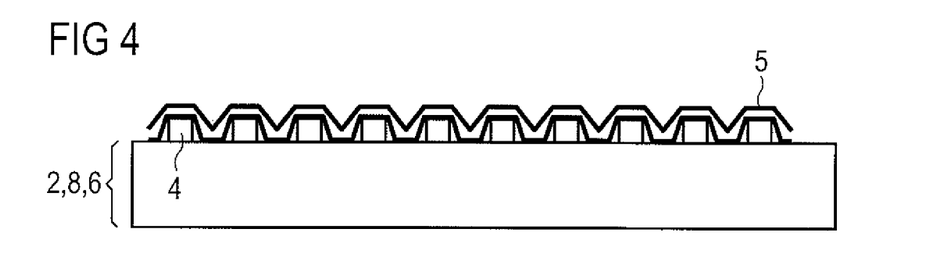
FIG. 4 shows a schematic cross-sectional view of a part of the layer structure shown in FIG. 3.

As is apparent in FIG. 4, the non-planar geometry of the growth layer 2 has the effect that the active zone 5 comprises a non-planar surface both on a side facing the growth layer 2 and on a side remote from the growth layer 2. As a result of the enlarged surface area, compressive strain can be reduced.

The active zone 5 does not comprise any discontinuities. The growth layer 2 may likewise be formed in a continuous way. Crystal facets may be provided at crystal-specific angles over the entire growth surface 3.

In the exemplary embodiment shown in FIG. 3, a first cladding layer 8, which preferably contains GaN, AlGaN or AlInGaN and is n-doped, and a first waveguide layer 2, which preferably contains GaN or InGaN and is n-doped, are firstly deposited on the substrate 6. The refractive index of the first cladding layer 8 is in particular lower than the refractive index of the first waveguide layer 2.

The first waveguide layer is structured at the surface, such that the structure elements 4 arise. The first waveguide layer 2 then simultaneously forms the growth layer 2.

The growth layer 2 is then grown over. The active zone 5, a second waveguide layer 9, which preferably contains GaN or InGaN and is p-doped, and a contact layer 12 are deposited.

A first semiconductor region comprises the waveguide layer 9 and the contact layer 12. A second semiconductor region comprises the growth layer 2 and the cladding layer 8. A top layer 7, which preferably replaces a cladding layer of semiconductor material, is applied to the first semiconductor region. The top layer 7 advantageously contains a TCO, whereby crystal quality is improved in comparison with a cladding layer of semiconductor material and production time can be shortened.

Finally, a metal contact 10 is arranged on the top layer 7.

Overall, all the measures, such as providing the growth layer 2 with structure elements 4 and making the top layer 7 of TCO, contribute to reducing strain. As well as improving quality, this has the advantage of lower piezoelectric barriers. Because of the lower piezoelectric barriers, growth may in this case also take place in polar crystal directions (e.g. along the c-axis).

Figure 5:
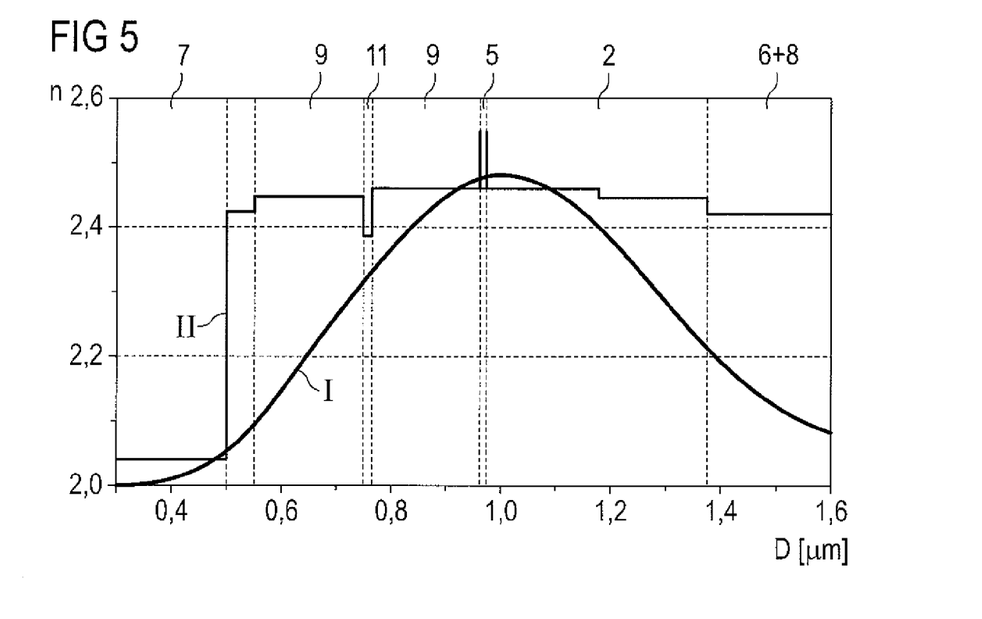
FIG. 5 shows a graph illustrating a simulated vertical optical mode in a laser diode chip according to a first exemplary embodiment.
Figure 6:
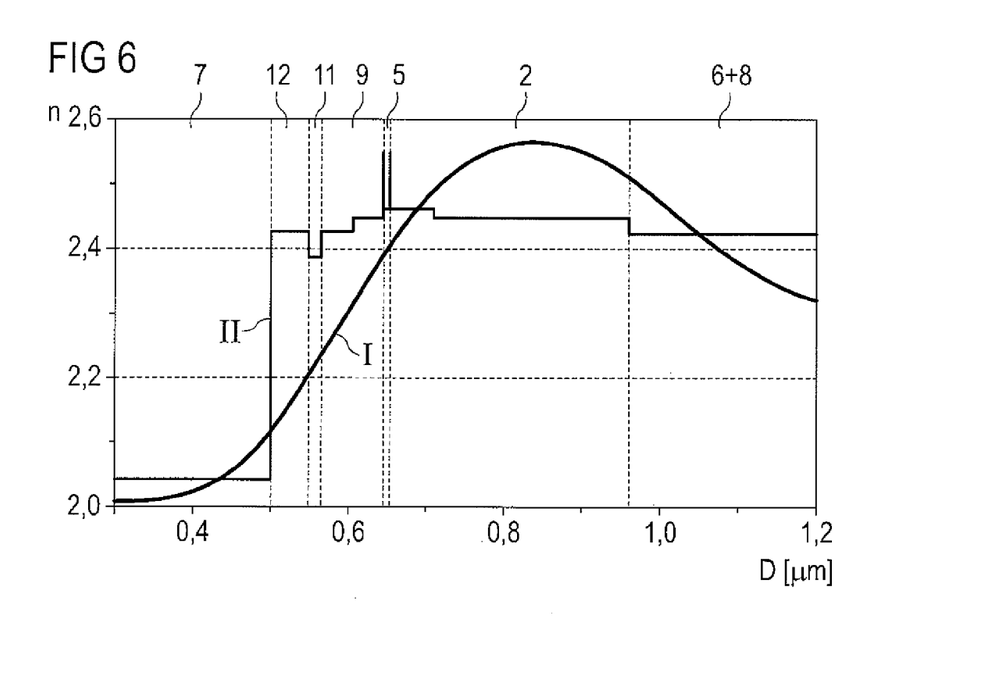
FIG. 6 shows a graph illustrating a simulated vertical optical mode in a laser diode chip according to a second exemplary embodiment.

The graphs in FIGS. 5 and 6 show simulated vertical optical modes for various laser diode chip designs. The laser diode chips are in principle constructed as shown in FIG. 3. However, wave guidance is optimised in various ways.

Curve I in each case shows the simulated vertical optical mode and curve II shows the profile of the refractive index n.

The graph in FIG. 5 is based on a laser diode chip which comprises a substrate 6 of n-GaN and a first cladding layer 8 arranged thereon which contains n-GaN and/or n-AlGaN. The refractive index n is lower than in the active zone 5 or the adjoining waveguide layer 2.

The waveguide layer 2 has a thickness D of approx. 400 nm and a spatially varying refractive index n, in particular with a stepped profile. The waveguide layer 2 may contain InGaN with a spatially varying indium content. The waveguide layer 2 is preferably n-doped.

The waveguide layer 2 is followed by the active zone 5, which has a thickness D of approx. 25 nm and an alternating refractive index n. In particular, the active zone 5 comprises a quantum structure.

The active zone 5 is adjoined by a second waveguide layer 9, within which is arranged an electron stop layer 11, as well as a contact layer 12 and a top layer 7.

The waveguide layer 9 has a thickness D of approximately 400 nm and a spatially varying refractive index n, which becomes lower towards the contact layer 12. The waveguide layer 9 is preferably p-doped and contains InGaN/GaN.

The contact layer 12 with a thickness D of 50 nm preferably contains p-GaN and has a refractive index n which is lower than in the waveguide layer 9.

In the top layer 7, which in particular contains a TCO and serves as a cladding layer, the refractive index n is relatively low. This permits good wave guidance and good shielding from the metal contact 10 (cf. FIG. 3). In the event of a sufficiently low contact resistance ($\sim 10^{-4}$ Ohm/cm$^2$) and layer resistance of the top layer 7, service life and output power may be increased over a conventional laser diode chip with a cladding layer of semiconductor material due to relatively low power losses in operation.

The laser diode chip forming the basis of the graph in FIG. 6 differs from the above-stated exemplary embodiment primarily in the thickness D of the second waveguide layer 9. The thickness D is here selected to be thinner. Production of the p-side, which typically takes place at temperatures which promote the diffusion of indium out of the active zone, is thus less time-consuming. Consequently, the quality of the active zone may be improved by the reduced thermal loading. This advantage compensates for the disadvantage of a lower fullness factor.

To summarise, it may be stated with regard to FIGS. 5 and 6 that InGaN-containing waveguide layers with a higher refractive index than GaN were predominantly used for the laser diode chips forming the basis of said Figures. This advantageously enables the use of GaN cladding layers or relatively thin AlGaN cladding layers and avoids the problem of strain, as may arise with thicker AlGaN cladding layers, which are used in conventional GaN-based laser structures.

Figure 7:
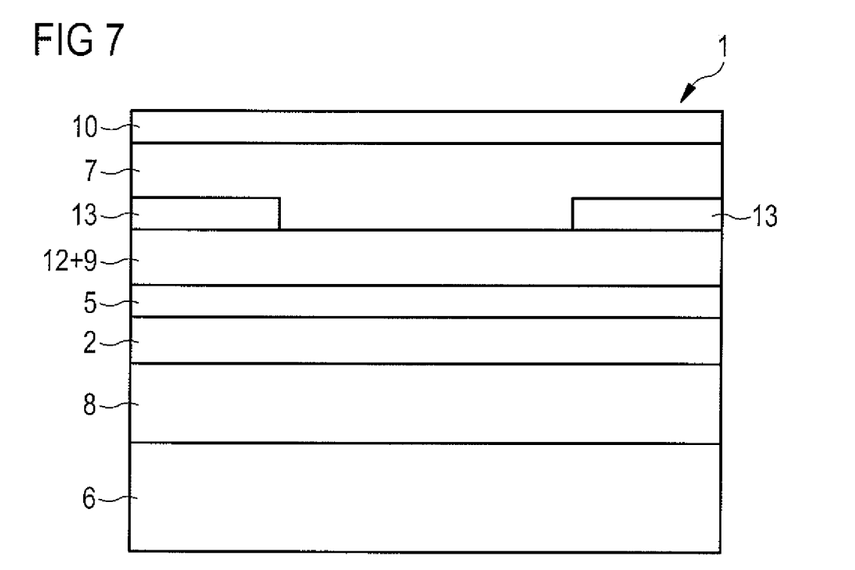
FIG. 7 shows a schematic cross-sectional view of a laser diode chip according to a first design.
Figure 8:
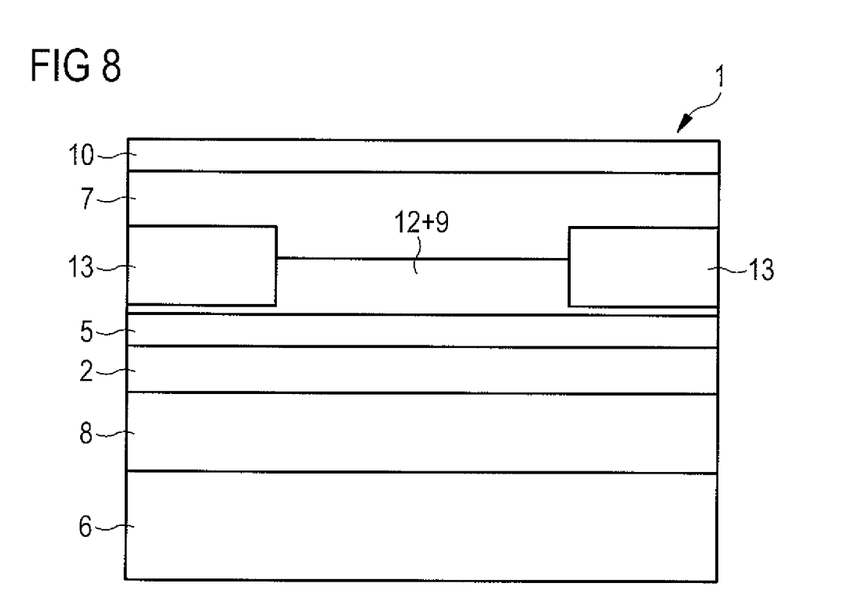
FIG. 8 shows a schematic cross-sectional view of a laser diode chip according to a second design.
Figure 9:
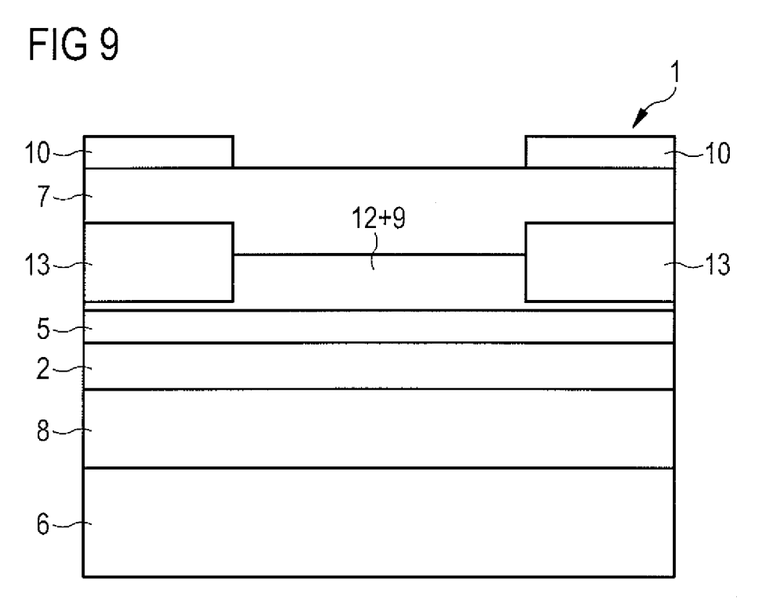
FIG. 9 shows a schematic cross-sectional view of a laser diode chip according to a third design.

FIGS. 7 to 9 show various exemplary embodiments of a optoelectronic semiconductor chip 1. All the exemplary embodiments constitute laser diode chips which preferably emit green light.

The optoelectronic semiconductor chips 1 in particular comprise a layer structure as explained in relation to FIGS. 3, 5 and 6.

In the semiconductor chips 1 of FIGS. 7 to 9 a passivation layer 13 with a central discontinuity is provided, which restricts current flow to a narrow strip-shaped region.

In the exemplary embodiment of FIG. 7 the waveguide and contact layer 9, 12 are formed over the entire surface. The passivation layer 13 is arranged on the waveguide and contact layer 9, 12 and is covered by the TCO-containing top layer 7, which moreover fills the strip region. A metal contact 10 is arranged over the entire surface of the top layer 7.

The laser diode chip illustrated may operate as a gain-guided laser. By selecting the passivation layer 13 with a lower refractive index than the top layer 7, however, lateral refractive index guidance may also take place, whereby the laser threshold and beam characteristics may be improved.

The laser diode chip shown in FIG. 8 comprises a waveguide and contact layer 9, 12 etched to form a strip, the side faces of which are covered by the passivation layer 13. The active zone 5 does not here have to be etched. This is because, by selecting the passivation layer 13 with a lower refractive index than the top layer 7, which is arranged on the passivation layer 13 and in the strip region, sufficiently good lateral refractive index guidance may take place. The top layer 7 is covered all over by a metal contact 10.

In the case of the laser diode chip shown in FIG. 9, the metal contact 10 is opened up in the strip region. This allows the use of a thin top layer 7, without risking absorption at the metal contact 10 arranged thereover. This design additionally allows optical pumping of the laser diode chip, wherein the pump light may be efficiently absorbed in the active zone 5 and the waveguide layers 2, 9. Optical pumping is advantageous for efficient charge carrier injection into the active zone 5 in particular in the case of a laser diode chip which emits green light, in that it allows the injection problems which arise with vertical electrical charge carrier transport to be avoided.

The invention is not restricted by the description given with reference to the exemplary embodiments. Rather, the invention encompasses any novel feature and any combination of features, including in particular any combination of features in the claims, even if this feature or this combination is not itself explicitly indicated in the claims or exemplary embodiments.

The invention claimed is:
1. An optoelectronic semiconductor chip comprising:
a substrate;
a cladding lever arranged directly on the substrate, the cladding layer has a planar top face facing away from the substrate;

a growth layer which contains at least one first nitride compound semiconductor material and which is directly applied on the cladding layer;

an active zone, which contains at least one second nitride compound semiconductor material and is arranged directly on the growth layer;

a top layer, which is arranged on the active zone and which is made of a transparent conductive oxide and which has a planar top side facing away from the active zone; and at least one further semiconductor layer which is arranged between the top layer and the active zone, wherein the growth layer has a first side facing the active zone and has a second side opposite of the first side, the first and the second side completely extend over the growth layer in a lateral direction, a plurality of structural elements is arranged on the first side of the growth layer, the structural elements having the form of protrusions or indentations in the first side of the growth layer and cover only a part of the first side and the structural elements are distributed at irregular intervals over the first side, and the second side of the growth layer is planar and runs in parallel with parts of the first side which are not covered with the structural elements.

2. The optoelectronic semiconductor chip according to claim 1, wherein the second nitride compound semiconductor material is an $In_{1-x-y}Al_xGa_yN$ with $0 \leq x \leq 1$, $0 \leq y < 1$ and $1-x-y \geq 0.15$.

3. The optoelectronic semiconductor chip according to claim 1, wherein the active zone emits radiation with a wavelength $\lambda$ of 435 nm or greater.

4. The optoelectronic semiconductor chip according to claim 1, wherein the structural elements have a height and width of at most $\lambda/n$, wherein $\lambda$ is the wavelength of the radiation emitted by the active zone and n denotes an average refractive index, which is calculated from the various refractive indices of the materials located in the semiconductor chip, with which radiation interacts.

5. The optoelectronic semiconductor chip according claim 1, wherein the first nitride compound semiconductor material is an $In_{1-x-y}Al_xGa_yN$ with $0 \leq x \leq 1$, $0 \leq y \leq 1$ and $x+y \leq 1$.

6. The optoelectronic semiconductor chip according to claim 1, wherein the active zone has a non-planar form caused by the presence of the structural elements.

7. The optoelectronic semiconductor chip according to claim 1, wherein a lattice mismatch f between substrate and active zone amounts to at least 0.5%.

8. The optoelectronic semiconductor chip according to claim 1, wherein the substrate contains GaN, AlN, SiC, sapphire, InGaN or ZnO.

9. The optoelectronic semiconductor chip according to claim 1, wherein a first semiconductor region, arranged between the active zone and the top layer, has a thickness of between at least 2 nm and at most 300 nm.

10. A method of producing an optoelectronic semiconductor chip according to claim 1, comprising the steps of:

forming a non-planar growth layer, which contains at least one first nitride compound semiconductor material and comprises structural elements at a growth surface;

arranging an active zone, which contains at least one second nitride compound semiconductor material, on the growth layer; and providing a top layer (7).

11. The method according to claim 10, wherein the top layer contains a transparent conductive oxide.

12. The method according to claim 10, wherein the growth layer is produced at a temperature of less than 850° C.

13. The method according to claim 10, wherein the structural structure elements are produced by means of photolithography, natural lithography, electron beam lithography, nano imprinting, wet chemical etching or dry etching.

14. The optoelectronic semiconductor chip according to claim 1, wherein the growth layer has an enlarged growth surface which reduces strain within the active zone.

15. The optoelectronic semiconductor chip according to claim 1, wherein the growth surface is enlarged via structuring.

16. The optoelectronic semiconductor chip according to claim 1, wherein the structural elements are distributed at irregular intervals over the growth surface.

17. A laser device including an optoelectronic semiconductor chip, comprising:

a substrate;

a cladding lever arranged directly on the substrate, the cladding layer has a planar top face facing away from the substrate;

a growth layer which contains at least one first nitride compound semiconductor material and which is directly applied on the cladding layer, wherein the first nitride compound semiconductor material is InGaN;

an active zone, which contains at least one second nitride compound semiconductor material and is arranged directly on the growth layer, wherein the second nitride semiconductor compound is $In_{1-x-y}Al_xGa_yN$, with $0 \leq x < 1$, $0 \leq y < 1$ and $1-x-y \geq 0.15$, and wherein the active zone has an indium content greater than that of the growth layer;

a top cladding layer, which is arranged on the active zone and which is made of a transparent conductive oxide and which has a planar top side facing away from the active zone, wherein by means of the top cladding layer, an optical wave is guided laterally in the laser diode chip while being shielded from metal contacts on an upper side of the optoelectronic semiconductor chip; and at least one further semiconductor layer which is arranged between the top layer and the active zone, wherein the growth layer has a first side facing the active zone and has a second side opposite of the first side, the first and the second side completely extend over the growth layer in a lateral direction, a plurality of cylindrically-shaped structural elements is arranged on the first side of the growth layer, the structural elements having the form of protrusions or indentations in the first side of the growth layer and cover only a part of the first side and the structural elements are distributed at irregular intervals over the first side, the active zone has a non-planar form caused by the presence of the structural elements, and the second side of the growth layer is planar and runs in parallel with parts of the first side which are not covered with the structural elements.

18. The optoelectronic semiconductor chip according to claim 1, wherein the second side of the growth layer is continuously planar between: (i) a portion opposite the part of the first side which is covered by the structural elements; and (ii) a portion opposite the parts of the first side which are not covered with the structural elements.

19. The laser device according to claim 17, wherein the second side of the growth layer is continuously planar between: (i) a portion opposite the part of the first side which is covered by the structural elements; and (ii) a portion opposite the parts of the first side which are not covered with the structural elements.

* * * * *